United States Patent
Gambino et al.

(10) Patent No.: US 6,413,870 B1
(45) Date of Patent: Jul. 2, 2002

(54) PROCESS OF REMOVING CMP SCRATCHES BY BPSG REFLOW AND INTEGRATED CIRCUIT CHIP FORMED THEREBY

(75) Inventors: Jeffrey P. Gambino, Gaylordsville, CT (US); William F. Landers, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/724,574

(22) Filed: Sep. 30, 1996

(51) Int. Cl.[7] .............................................. H01L 21/301
(52) U.S. Cl. ...................... 438/692; 438/694; 438/698; 438/760; 216/89
(58) Field of Search ................................ 438/692, 694, 438/698, 760; 216/89

(56) References Cited

U.S. PATENT DOCUMENTS

| | | | | |
|---|---|---|---|---|
| 4,721,548 A | * | 1/1988 | Morimoto | 438/697 |
| 4,799,992 A | * | 1/1989 | Rao et al. | 438/632 |
| 5,104,482 A | | 4/1992 | Monkowski et al. | 438/698 |
| 5,127,196 A | | 7/1992 | Morimoto et al. | 451/7 |
| 5,198,387 A | * | 3/1993 | Tang | 438/684 |
| 5,244,534 A | * | 9/1993 | Yu et al. | 438/672 |
| 5,314,843 A | * | 5/1994 | Yu et al. | 438/692 |
| 5,405,489 A | | 4/1995 | Kim et al. | 438/698 |
| 5,434,107 A | | 7/1995 | Paranjpe | 438/760 |
| 5,488,007 A | * | 1/1996 | Kim et al. | 438/698 |
| 5,514,245 A | | 5/1996 | Doan et al. | 438/693 |
| 5,573,633 A | * | 11/1996 | Gambino et al. | 438/533 |

* cited by examiner

Primary Examiner—Mark Chapman
(74) Attorney, Agent, or Firm—Schmeiser, Olsen & Watts; Daryl K. Neff

(57) ABSTRACT

A method for removing scratches from a dielectric layer comprising the steps of: providing a layer of a reflowable dielectric material; and heating the dielectric layer to a temperature sufficient to cause the reflowable dielectric material to reflow is provided. This method provides a manner to remove the scratches created during the chemical mechanical polish steps, which can later become filled with metallization, causing shorts in the circuitry and subsequent integrated circuit chip failure.

20 Claims, 3 Drawing Sheets

PROCESS OF REMOVING CMP SCRATCHES BY BPSG REFLOW AND INTEGRATED CIRCUIT CHIP FORMED THEREBY

BACKGROUND OF THE INVENTION

1. Technical Field

The present invention relates generally to a process of manufacturing an integrated circuit chip and the integrated circuit chip formed thereby. More specifically, the present invention relates to the removal of scratches formed during chemical mechanical polish (CMP) steps by heating to a temperature high enough to cause the borophosphosilicate glass (BPSG) to reflow, thereby providing a smooth, planar surface.

2. Background Art

In the fabrication of integrated circuit (IC) chips, it is necessary to form a perfectly planar surface over gate topography in order to allow the subsequent layers to be properly aligned. In order to reduce topography associated with underlying structures, a borophosphosilicate glass is typically used, because it is a good dielectric substance that is also capable of being reflowed in order to eliminate voids and reduce topography. This planar surface is then overlaid sequentially with numerous layers of material which function as conductors, semi-conductors and insulators. Each subsequent layer is deposited and patterned usually by photolithographic techniques such that the sequence of layers form a complex array of electronic circuitry. However, the multiple layers can be formed only with difficulty unless the substrate topography is planarized in an early stage of the manufacturing process. The substrate topography must be as closely as possible to a planar surface throughout subsequent layer depositions because of problems associated with topography such as limited depth of focus during lithography, metal residues during reactive ion etching (RIE) and poor metal step coverage.

It is often necessary to polish a semiconductor wafer in order to remove topography, surface defects such as crystal lattice damage, scratches, roughness, or embedded particles such as dirt or dust. This polishing process is typically referred to as a chemical mechanical polish "CMP" and is utilized to improve the quality of and reliability of semiconductor devices. The CMP process is usually performed during the formation of various devices and interconnecting wiring on the wafer.

In general, the CMP process involves holding a thin flat wafer against a rotating wetted polishing surface under a controlled downward pressure. A polishing slurry such as a solution of alumina or silica may be used as the abrasive medium. A rotating polishing head or wafer carrier is typically utilized to hold the wafer under controlled pressure against a rotating polishing platen. The polishing platen is typically covered with a relatively soft wetted pad material such as a blown polyurethane.

A particular problem encountered in the CMP process is that micro scratches may be formed during the polishing process. These micro scratches are particularly damaging in inter-connection levels formed using the damascene technique because the metal layer that is deposited on the surface will become trapped in the scratch, thus causing short failure of the IC chip. Previously, this problem has been remedied to the extent possible by performing a touch-up CMP using a softer pad to try to eliminate the scratches, as shown in U.S. Pat. No. 5,514,245 issued to Doan et al. on May 7, 1996, assigned to Micron Technology, Inc. and incorporated herein by reference. However, although the touch-up CMP may minimize the scratch effect, it is difficult to remove the scratches without also over-polishing the entire layer. Also, this touch-up CMP adds time consuming process steps that must be carefully monitored and controlled to prevent the over-polishing. Therefore, there exists a need in the art to provide an inexpensive, reliable way to remove scratches formed during CMP steps of IC chip formation.

SUMMARY OF THE INVENTION

The present invention provides a process of manufacturing an integrated circuit chip using a reflow step to the oxide in order to remove scratches. Once the oxide has been subjected to the CMP process, the scratches may be removed by reflow. If BPSG is used as the interlevel dielectric, it may be reflowed at temperatures as low as 750° Celsius (C). Accordingly, the BPSG is reflowed and the scratches are removed, thereby enhancing the final yield of IC chips from the wafer, because fewer failures will have occurred due to shorts from metallized scratches.

This is also accomplished without the expensive and time consuming touch-up polish, as the process has only two variables, namely, time and temperature. Numerous other features and advantages of the present invention will become readily apparent from the following detailed description of the preferred embodiment, the accompanying drawings, and the appended claims.

BRIEF DESCRIPTION OF THE DRAWINGS

The preferred exemplary embodiment of the present invention will hereinafter be described in conjunction with the appended drawings, wherein like designations denote like elements, and.

DETAILED DESCRIPTION OF THE PREFERRED EMBODIMENT

Although this invention is susceptible to embodiment in many different forms, a preferred embodiment of the invention is shown. It should be understood, however, that the present disclosure is to be considered as an exemplification of the principles of this invention and is not intended to limit the invention to the embodiment illustrated.

A preferred embodiment of the present invention relies on the fact that borophosphosilicate glass (BPSG) will reflow to provide a planar surface at temperatures low enough that damage will not be done to the underlying layers of metallization.

In the typical integrated circuit (IC) chip manufacturing process, a technique known as the "damascene technique" is commonly used for the production of the electronic circuitry on the surface of the chip that interconnects the various devices. This technique involves: starting with a surface; chemical mechanical polishing (CMP) the surface; applying a photoresist; also known as simply a resist material that is chemically responsive to an actinic energy source; exposing the photoresist material to the actinic energy source to change the solubility characteristics of the resist material; developing the resist material to create protected areas and unprotected areas; reactive ion etching (RIE) the unprotected areas to form holes; lines, trenches or whatever areas of metallization are needed; removing the resist; depositing a layer of metal over the entire surface; thereby filling the holes formed by the RIE step; and polishing the excess metal off using a CMP process.

Because the CMP process is utilized repetitively in the manufacturing process of IC chips, there are many steps at which the process of the present invention may be used. For example, when the surface is being planarized, the CMP process is used. This process may presently form scratches that could become filled with metal when the metal is deposited. Should the scratches become filled with metal, it is more likely that a short may occur in the circuitry, thereby causing failure of the chip. In order to remedy this situation, the present invention directs that the borophosphosilicate glass (BPSG) oxide layers be reflowed prior to the deposition of the resist material.

Figure 1:
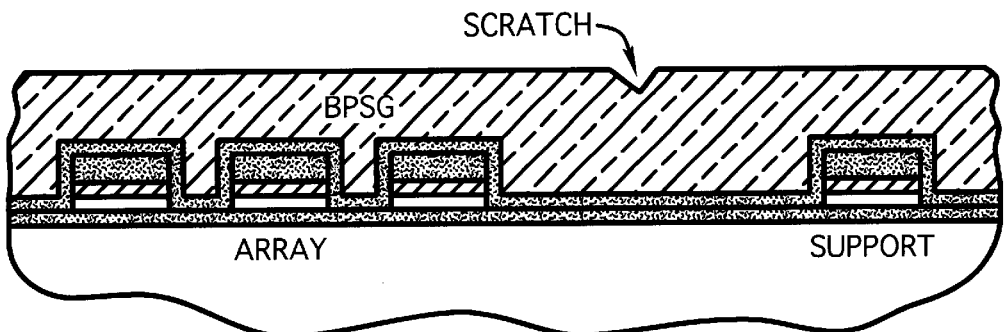
FIGS. 1–4 are schematics depicting the step-wise formation of a scratch and the resulting electrical short.

As shown in FIG. 1, an IC chip comprises an area of devices for an array and an area of devices for supports. The IC chip itself is made up of a silicon or other semiconductive material and has areas of semiconductor doping and areas of isolation. Gates are formed on the surface of the IC chip by layering a silicon oxide, a polysilicon, and a tungsten silicide on the surface and then defining the gate structures by a lithographic process followed by a RIE step. This structure is then coated with a thin layer of a silicon nitride. In order to reduce the topography created by the gates, the entire surface is covered with a layer of BPSG.

Figure 2:
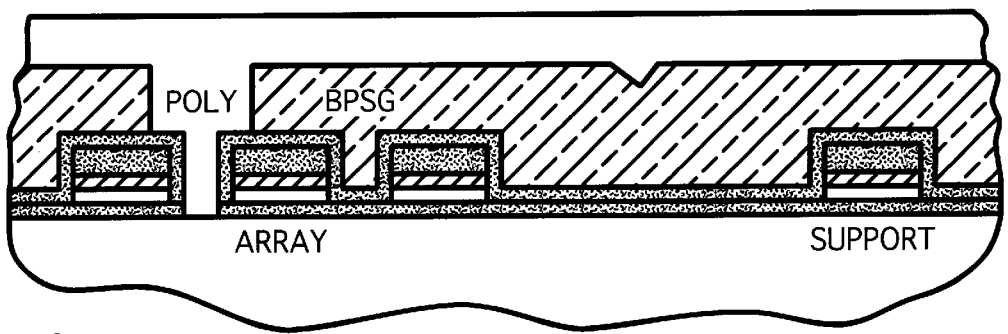
Figure 3:
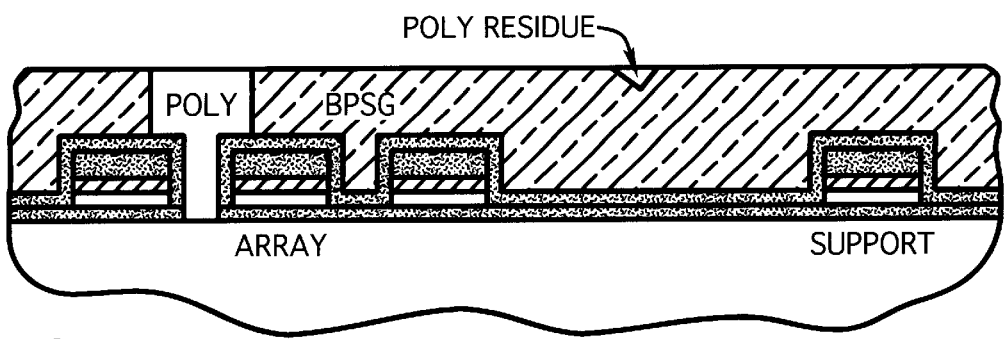
Figure 4:
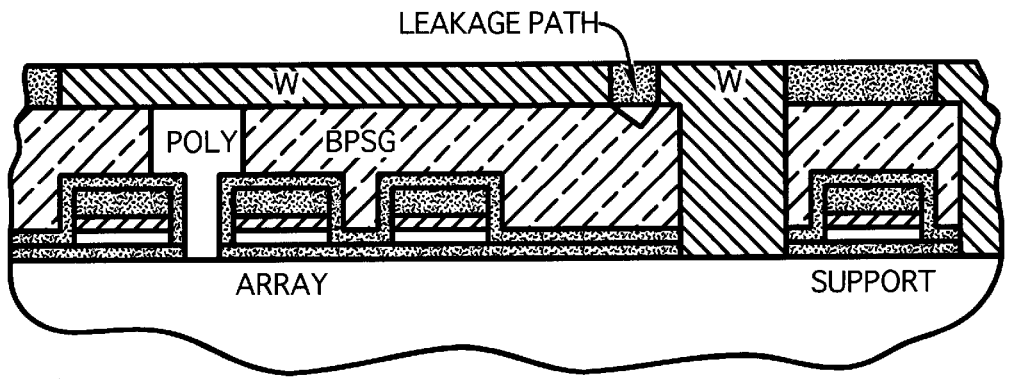

This layer of BPSG is then planarized by a CMP step, to planarize the surface. Occasionally, as shown in FIG. 1, a scratch will be formed by this CMP step. The borderless contacts for the array are then defined and etched by lithography and RIE, and the conductive polysilicon is deposited over the entire surface. As is shown in FIG. 2, the scratch is also filled with polysilicon during the deposition process, thus creating an area of polysilicon residue trapped in the scratch area as shown in FIG. 3, after the excess polysilicon has been etched back to form a polysilicon stud. The tungsten metal studs and bitlines are then defined and deposited on the surface of the IC chip, as shown in FIG. 4. The shorting problem is readily apparent, as one can easily see that the tungsten stud and the tungsten bitline will be electrically connected by the polysilicon residue from the previous layer. Thus, the polysilicon residue forms a leakage path, which causes the IC chip to fail during product testing.

Figure 5:
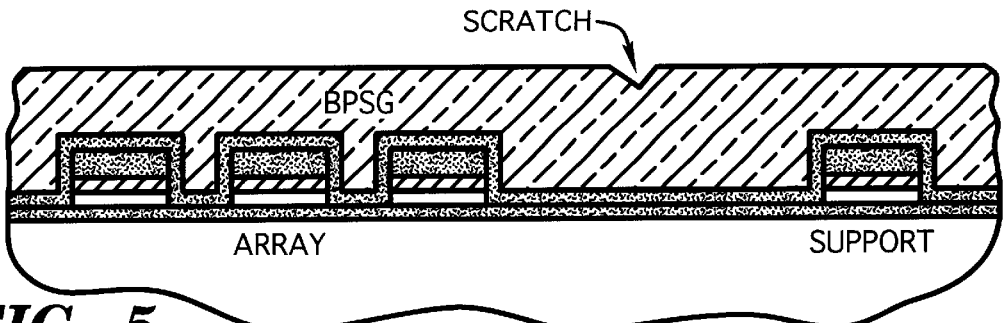
FIGS. 5–9 are schematics depicting the step-wise formation of a scratch, removal of the scratch by the process of the present invention and the integrated circuit chip formed thereby.
Figure 6:
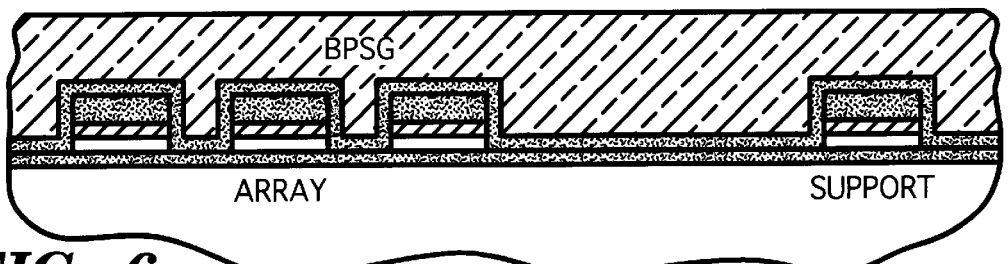

In order to resolve this problem, the present invention provides a means by which the polysilicon residue may be avoided, thus preventing chip failure. As shown in FIG. 5, a scratch is formed by the CMP step. The BPSG is then reflowed at a temperature in the range of about 750° Celsius (C) to about 1100° C. in a rapid thermal anneal tool for times varying from about 10 sec to 30 min. The preferred temperature will depend on the processing steps of the wafer and the temperatures involved in those processing steps. Typically, the optimal temperature is approximately the highest processing temperature, which is about 950° C. in the standard DRAM processing scheme. The anneal ambient is not critical, although it may be desirable to use steam ambients if possible (i.e., if underlying structures are insensitive to oxidation) in order to reduce the reflow temperature. As shown in FIG. 6, once the BPSG has been reflowed, the scratch is eliminated and the surface is planar.

Figure 7:
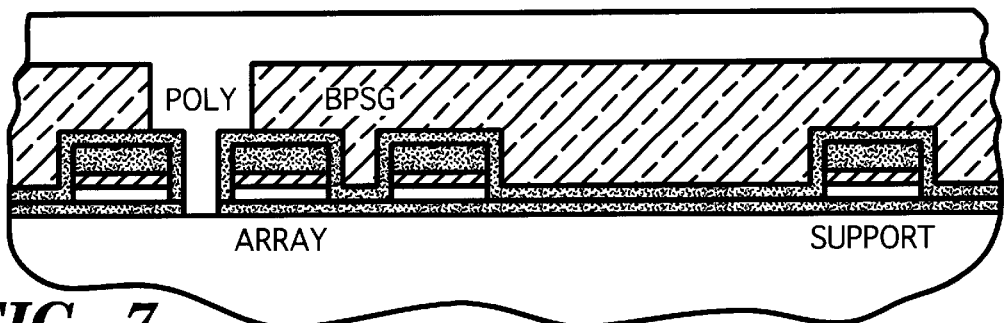
Figure 8:
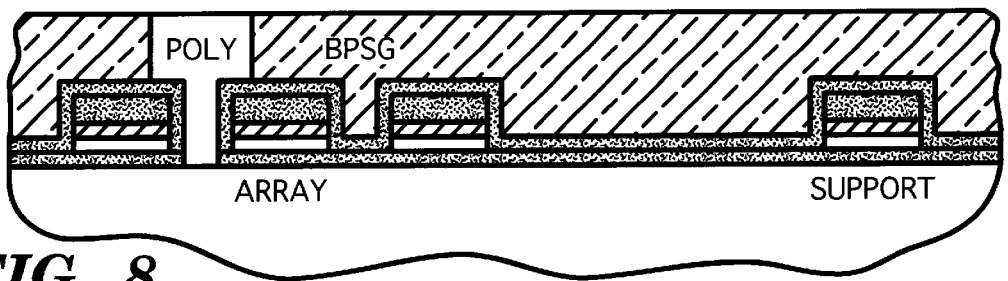
Figure 9:
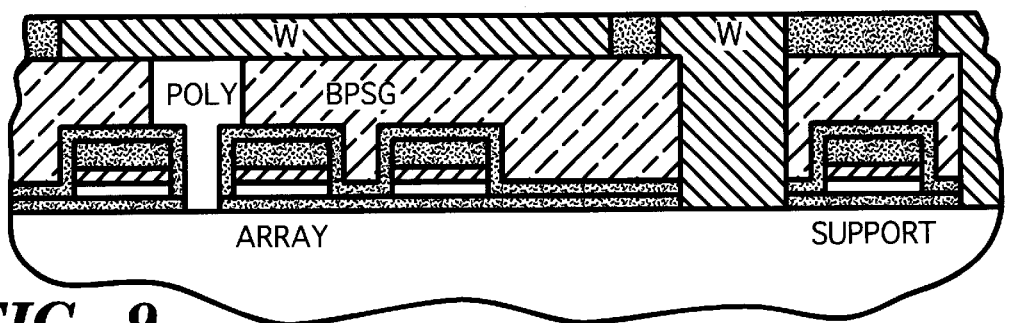

The processing may then be continued as usual, etching the array contacts and depositing a layer of polysilicon, or simply "poly", to form the contacts, as shown in FIG. 7. The poly is then CMP etched back, leaving only studs, as depicted in FIG. 8. FIG. 9 is a schematic of the product, in which the tungsten studs and bitlines have been fabricated. As is readily apparent, the difference between the product of FIG. 4 and the product of FIG. 9 is the lack of a possible leakage path in FIG. 9.

Figure 10:
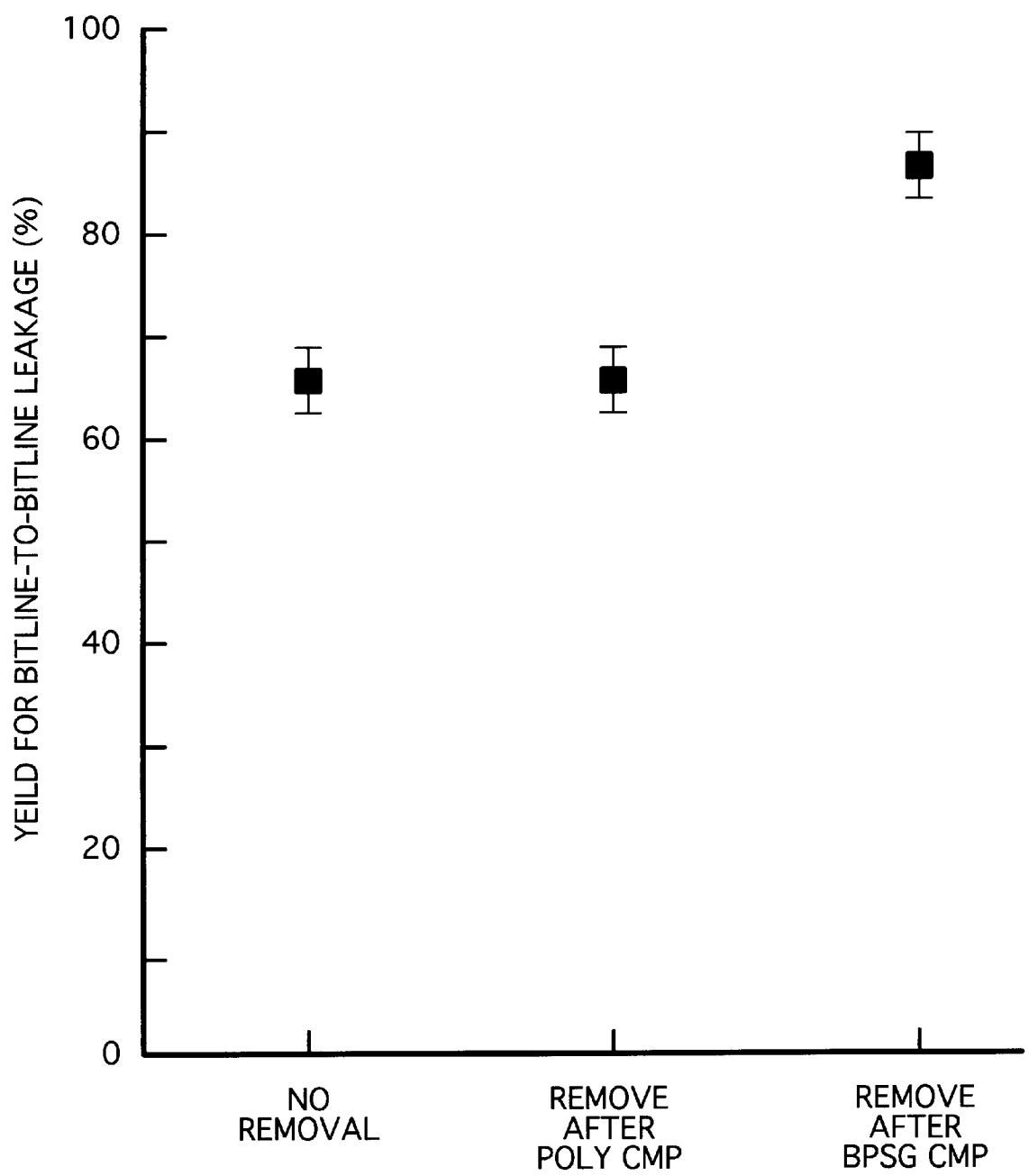
FIG. 10 is a graphical depiction of the improved yield obtained by utilizing the process of the present invention.

It has been found that, while it might have been thought to have been advantageous to reflow the BPSG at every possible instance, the critical time to remove the scratches is before the deposition of the polysilicon. As shown in FIG. 10, the yield for bitline-to-bitline leakage (in percent) is not significantly affected by BPSG reflow after the polysilicon is deposited and planarized. On the other hand, the yield does increase significantly, from about 65% to about 85%, when the BPSG is reflowed, removing the scratches, after the BPSG is subjected to the CMP step. Of course, this process could be used on any material that can flow at a reasonable temperature, such as glasses doped with As, B, P, Ge, or F. However, reflow conditions must be adjusted for the glass that is used.

This invention has been described in terms of specific embodiments, set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

Accordingly, what is claimed is:

1. A method for removing scratches from a dielectric layer comprising the steps of:
   providing a layer of a reflowable dielectric material;
   subjecting the layer to a chemical mechanical polish; and
   removing scratches formed during the chemical mechanical polish by heating the layer of the reflowable dielectric material to a temperature sufficient to cause the reflowable dielectric material to reflow.

2. The method of claim 1, wherein the reflowable dielectric material is a glass.

3. The method of claim 2, wherein the glass is doped with at least one dopant and wherein the dopant is selected from the group consisting of: arsenic, boron, phosphorus, germanium, and fluorine.

4. The method of claim 1, wherein the temperature sufficient to cause the reflowable dielectric to reflow is in the range of about 750° C. to about 1100° C.

5. The method of claim 4, wherein the dielectric layer is heated in a rapid thermal anneal tool.

6. The method of claim 1, wherein the heating step is performed for a period of time and wherein the period of time is in the range of about 10 seconds to about 30 minutes.

7. The method of claim 5, wherein the heating step is performed in an ambient atmosphere and wherein the ambient atmosphere is selected from the group consisting of: steam ambients.

8. The method of claim 1, further comprising the steps of:
   defining a pattern in the layer of the reflowable dielectric material;
   depositing a conductive material on the surface of the reflowable dielectric material; and
   patterning the conductive material by chemical mechanical polishing.

9. A method for manufacturing an integrated circuit chip comprising the steps of:
   providing a substrate;
   depositing a layer of a reflowable dielectric material on a surface of the substrate;

defining a pattern in the layer of the reflowable dielectric material, thereby forming a patterned substrate;

non-selectively depositing a conductive layer over a surface of the patterned substrate;

chemical mechanical polishing the conductive layer to the surface of the patterned substrate; and removing scratches on the surface of the dielectric material by heating the layer of the reflowable dielectric material to a temperature sufficient to cause the reflowable dielectric material to reflow.

10. The method of claim 9, wherein the reflowable dielectric material is a glass.

11. The integrated circuit chip preduced by the method of claim 10.

12. The method of claim 10, wherein the glass is doped with at least one dopant and wherein the dopant is selected from the group consisting of: arsenic, boron, phosphorus, germanium, and fluorine.

13. The integrated circuit chip preduced by the method of claim 12.

14. The method of claim 9, wherein the temperature sufficient to cause the reflowable dielectric to reflow is in the range of about 750° C. to about 1100° C.

15. The integrated circuit chip preduced by the method of claim 14.

16. The method of claim 14, wherein the heating is performed in a rapid thermal anneal tool for a period of time and wherein the period of time is in the range of about 10 seconds to about 30 minutes.

17. The integrated circuit chip preduced by the method of claim 16.

18. The method of claim 9, wherein the heating step is performed in an ambient atmosphere and wherein the ambient atmosphere is selected from the group consisting of: steam ambients.

19. The integrated circuit chip preduced by the method of claim 18.

20. The integrated circuit chip preduced by the method of claim 9.

* * * * *

UNITED STATES PATENT AND TRADEMARK OFFICE
CERTIFICATE OF CORRECTION

PATENT NO.    : 6,413,870 B1                                            Page 1 of 1
DATED         : July 2, 2002
INVENTOR(S)   : Gambino et al.

It is certified that error appears in the above-identified patent and that said Letters Patent is hereby corrected as shown below:

Title page,
Item [*] Notice, delete "0" and insert -- 868 --.

Signed and Sealed this

Thirtieth Day of August, 2005

JON W. DUDAS
*Director of the United States Patent and Trademark Office*